US005416451A

United States Patent [19]

Kaltenecker et al.

[11] Patent Number: 5,416,451

[45] Date of Patent: May 16, 1995

[54] CIRCUIT AND METHOD FOR BALUN COMPENSATION

[75] Inventors: Robert S. Kaltenecker, Mesa; Henry L. Pfitzenmayer, Phoenix; Frederick C. Wernett, Flagstaff, all of Ariz.

[73] Assignee: Motorola, Inc., Schaumburg, Ill.

[21] Appl. No.: 124,875

[22] Filed: Sep. 22, 1993

[51] Int. Cl.[6] .......... H03H 7/42

[52] U.S. Cl. .......... 333/25; 333/26

[58] Field of Search .......... 333/25, 26, 131

[56] References Cited

U.S. PATENT DOCUMENTS

| | | | |
|---|---|---|---|
| 2,658,959 | 11/1953 | Doherty | 333/25 X |
| 4,945,317 | 7/1990 | Sato et al. | 333/25 X |
| 5,039,891 | 8/1991 | Wen et al. | 333/25 X |
| 5,045,822 | 9/1991 | Mohwinkel | 333/25 X |
| 5,296,823 | 3/1994 | Dietrich | 333/26 |

*Primary Examiner*—Paul Gensler
*Attorney, Agent, or Firm*—Rennie William Dover

[57] ABSTRACT

A novel circuit and method for providing amplitude and phase compensation for a balun in order to provide first and second voltage signals that are balanced has been provided. The compensation is achieved by adding an amplitude and phase compensation circuit such as a transmission line (14) or inductive (20) and capacitive (22) lumped elements in series with one of the ports of the balun on the balanced side. The amplitude and phase compensation circuit includes a characteristic impedance parameter (Zo) and an electrical length parameter (Eo) that are optimized such that the amplitude difference between first and second voltage signals is minimized, while the magnitude of the phase difference between first and second voltage signals is maximized.

11 Claims, 2 Drawing Sheets

CIRCUIT AND METHOD FOR BALUN COMPENSATION

FIELD OF THE INVENTION

This invention relates to baluns and, in particular but not limited to, a circuit and method for compensating baluns.

BACKGROUND OF THE INVENTION

A balun is a well known device having a single ended (unbalanced) side and a balanced side. The function of a balun is to provide voltages at first and second ports of its balanced side which are substantially equal in amplitude and substantially 180° out of phase with respect to each other. In other words, the balun is to provide equal and opposite voltages to a balanced load with respect to ground.

When utilizing a balun, the balun must be impedance matched with the rest of the system in order to minimize losses and distortion and maximize bandwidth, for example, in balanced amplifier applications. In trying to match the balun with the system, the prior art utilizes traditional measurements on the single ended side of the balun. For example, in measuring the frequency response of a balun, first and second baluns are serially coupled wherein their balanced sides are interconnected. A signal is applied at the single ended side of the first balun, while the signal appearing at the single ended side of the second balun is observed. From this measurement, one can obtain the bandwidth, insertion loss and return loss for each balun (assuming that each balun is substantially identical). However, these measurements do not convey any information about the amplitude and phase relationships appearing at the balanced side of the balun.

Hence, there exists a need for recognizing that the amplitude and phase of the voltage signals appearing at the balanced side of a balun may degrade with frequency and for further providing a circuit and method for providing compensation for such amplitude and phase degradation.

SUMMARY OF THE INVENTION

Briefly, the present invention provides a circuit and a method for amplitude and phase compensating first and second voltages appearing at the balanced side of a balun. The present invention first realizes that the amplitude and phase of the voltages appearing at the balanced side of a balun do indeed degrade with frequency. Further, the present invention provides an amplitude and phase compensation circuit having a predetermined optimized electrical length and characteristic impedance that is inserted in series with a port on the balanced side of the balun. The characteristic impedance is optimized such that the amplitude difference between first and second voltage signals is minimized. Further, the electrical length is optimized such that the magnitude of the phase difference between first and second voltage signals is maximized.

DETAILED DESCRIPTION OF THE DRAWINGS

Figure 1:
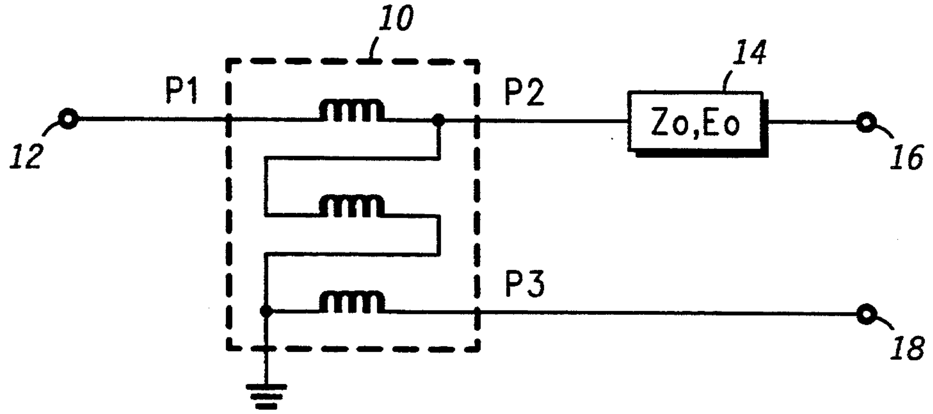
FIG. 1 is a detailed schematic diagram illustrating a first embodiment of an amplitude and phase compensated balun in accordance with the present invention.

Referring to FIG. 1, a detailed schematic diagram illustrating a circuit and method for providing amplitude and phase compensation for voltage signals appearing at first and second ports on the balanced side of balun 10 is shown. Balun 10 is shown as a three port device having first port P1 coupled to terminal 12, second port P2 coupled through amplitude and phase compensation circuit 14 to terminal 16. Further, balun 10 includes third port P3 coupled to terminal 18. It is understood that port P1 is on the single ended side of balun 10, while ports P2 and P3 are on the balanced side of balun 10. Further, it is understood that balun 10 includes three twisted wires wherein a first wire has a first end coupled to port P1 and a second end coupled to a first end of a second wire and to port P2 Further, the second end of the second wire is coupled to a first end of a third wire, while the second end of the third wire is coupled to port P3.

In general, if an input signal is applied at terminal 12 (and hence to port P1 ), then ideally ports P2 and P3 of balun 10 should provide equal amplitude voltage signals that are substantially 180° out of phase and wherein the amplitude of these voltage signals is substantially equal to one-half the amplitude of the voltage signal applied terminal 12 (less any loss through balun 10 as is understood).

The present invention realizes that as the frequency of operation of balun 10 increases, the voltage signals appearing at ports P2 and P3 degrade with respect to frequency. That is, as the frequency increases, the amplitude difference between the voltage signals appearing at ports P2 and P3 increases, while the phase difference between the voltage signals appearing at ports P2 and P3 are no longer substantially 180° out of phase with respect to each other.

Moreover, the present invention then realizes that by inserting an amplitude and phase compensation circuit such as transmission line 14 in series with port P2 the amplitude and phase of first and second voltage signals respectively appearing at terminals 16 and 18 can be compensated with respect to frequency. In particular, by appropriately selecting optimized values for the characteristic impedance (Zo) and the electrical length (Eo) of transmission line 14 the amplitude difference between the first and second voltage signals can be minimized, while the magnitude of the phase difference between the first and second voltage signals can be maximized. By maximizing the magnitude of the phase difference between the first and second voltage signals, it is intended to mean that the phase difference between the first and second voltage signals is made substantially equal to 180°. In this manner, the first and second voltage signals provided at terminals 16 and 18 are said to be balanced.

In order to optimize the values for the characteristic impedance and the electrical length of transmission line 14 any RF linear analysis program capable of handling distributed elements may be utilized such as Hewlett Packard's Microwave Design System (MDS) or Touchstone. For example, by taking three port measurements at ports P1, P2 and P3 of balun 10, a mathematical model of balun 10 can be created as is well known in the art. Further, by adding transmission line 14 in series at port P2 a mathematical model of the circuit shown in FIG. 1 can be created.

The characteristic impedance and the electrical length of transmission line 14 is then optimized by simultaneously selecting a characteristic impedance such that the amplitude difference between the first and second voltage signals appearing at terminals 16 and 18 is minimized, while the magnitude of the phase difference between the first and second voltage signals appearing at terminals 16 and 18 is concurrently maximized.

In summary, the present invention provides an amplitude and phase compensation circuit in series with a port on a balanced side of a balun in order to provide first and second voltage signals that are balanced. The amplitude and phase compensation circuit has at least two parameters associated therewith: i) a characteristic impedance and ii) an electrical length. The characteristic impedance and the electrical length of the amplitude and phase compensation circuit are selected such that the amplitude difference between the first and second voltage signals is minimized, while the magnitude of the phase difference between the first and second voltage signals is maximized.

Figure 2:
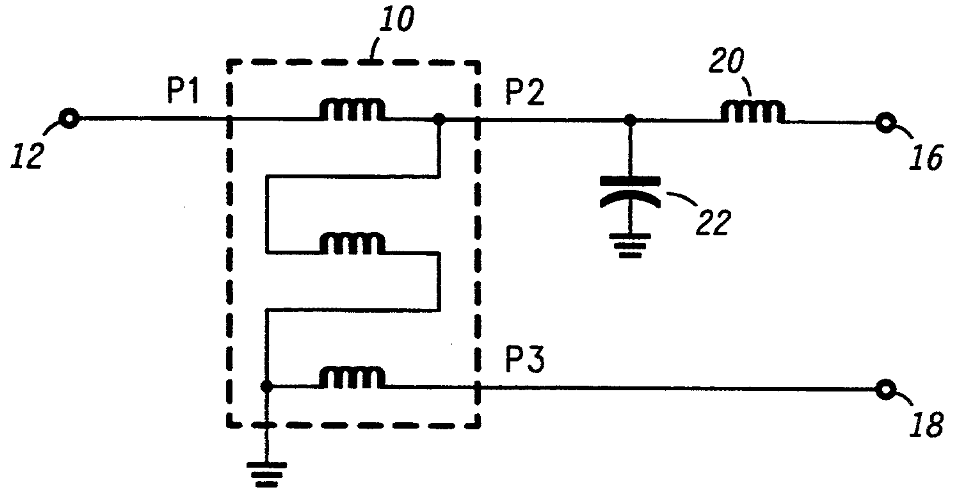
FIG. 2 is a detailed schematic diagram illustrating a second embodiment of an amplitude and phase compensated balun in accordance with the present invention.

Although FIG. 1 shows transmission line 14 being utilized to provide the amplitude in phase compensation, it is understood that a combination of lumped inductive and capacitive components having selected characteristic impedance and electrical length could also be utilized as shown in FIG. 2. In particular, FIG. 2 illustrates the amplitude and phase compensation circuit to include inductor 20 and capacitor 22 wherein inductor 20 is coupled between the second port of balun 10 and terminal 16 while capacitor 22 is coupled between port P2 and ground reference. Moreover, it should be understood that other variations of lumped components may also be utilized such as including an additional capacitor coupled between terminal 16 and ground reference.

Figure 3:
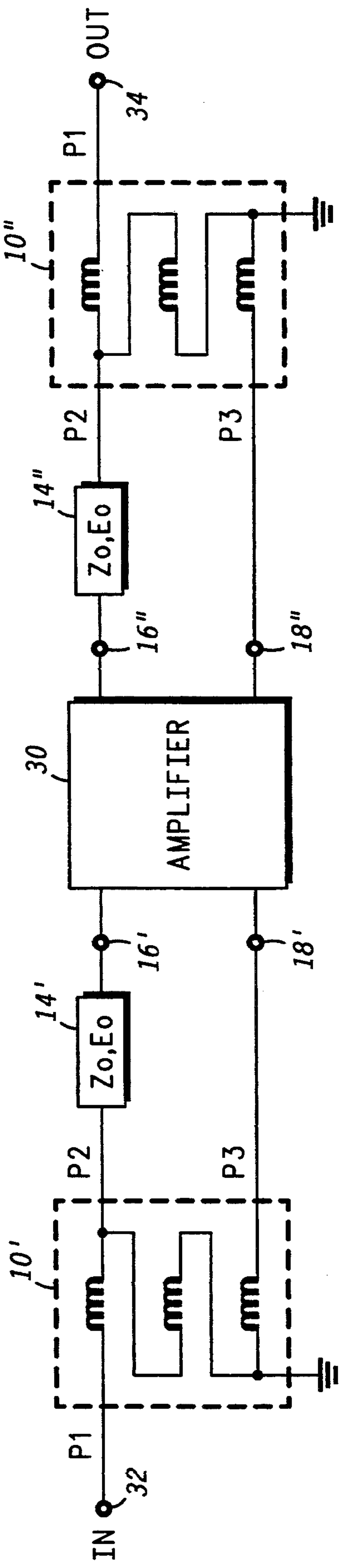
FIG. 3 is a detailed schematic/block diagram utilizing the present invention to improve performance of an amplifier.

Referring to FIG. 3, a detailed schematic/block diagram utilizing the circuit shown in FIG. 1 to improve performance of an amplifier is shown. It is understood that components shown in FIG. 3 that are identical to components shown in FIG. 1 are identified by the same reference numbers. For example, baluns 10' and 10" of FIG. 3 are the same as balun 10 of FIG. 1. Moreover, transmission lines 14' and 14" of FIG. 3 are identical to transmission line 14 of FIG. 1.

The circuit shown in FIG. 3 further includes amplifier 30 for example, a cable television (CATV) amplifier, having balanced inputs and outputs.

In operation, balun 10' is utilized to take a single ended input signal appearing at terminal 32 in order to provide balanced signals at the balanced inputs of amplifier 30 via terminals 16' and 18'. Moreover, balun 10" is utilized to take the balanced outputs of amplifier 30 via terminals 16" and 18" and provide a single ended output signal at terminal 34. Thus, by utilizing baluns 10' and 10" to provide substantially balanced signals at the inputs and outputs of amplifier 30 the performance of amplifier 30 is substantially improved. For example, the bandwidth of amplifier 30 is increased and the distortion of amplifier 30 is reduced. These improvements can be critical for CATV amplifiers.

By now it should be apparent from the foregoing discussion that a novel circuit and method for providing amplitude and phase compensation for a balun in order to provide first and second voltage signals that are balanced has been provided. The compensation is achieved by adding an amplitude and phase compensation circuit such as a transmission line or inductive and capacitive lumped elements in series with one of the ports of the balun on the balanced side. The amplitude and phase compensation circuit includes characteristic impedance and electrical length parameters that are optimized such that the amplitude difference between first and second voltage signals is minimized, while the magnitude of the phase difference between first and second voltage signals is maximized.

We claim:

1. A circuit having first, second, and third terminals, comprising:

a three-wire twisted-wire balun having first, second, and third ports, said first port being coupled to the first terminal, said third port being coupled to the third terminal; and an amplitude and phase compensation circuit coupled between said second port of said three-wire twisted-wire balun and the second terminal, said amplitude and phase compensation circuit having a characteristic impedance and an electrical length selected such that the amplitudes of voltage signals appearing at the second and third terminals are substantially equal within an operating bandwidth and a magnitude of a phase difference of said voltage signals appearing at the second and third terminals is substantially equal to 180 degrees within the operating bandwidth.

2. The circuit according to claim 1 wherein said amplitude and phase compensation circuit includes a transmission line.

3. The circuit according to claim 1 wherein said amplitude and phase compensation circuit includes inductive and capacitive components.

4. The circuit of claim 1, wherein the amplitudes of the voltage signals appearing at the second and third terminals are substantially equal to one-half of the voltage signal applied at the first terminal.

5. A method for providing amplitude and phase compensated first and second voltage signals at a balanced side of a three-wire twisted-wire balun, the three-wire twisted wire balun having first, second, and third ports, the method comprising the steps of:

inserting an amplitude and phase compensation circuit in series with the second port of the balun;

selecting a characteristic impedance of said amplitude and phase compensation circuit so that amplitudes of the first and second voltage signals are substantially equal within a frequency of operation; and selecting an electrical length of said amplitude and phase compensation circuit so as to set a phase difference between the first and second voltage signals to be substantially 180 degrees within the frequency of operation.

6. The method according to claim 5 wherein said amplitude and phase compensation circuit includes a transmission line.

7. The method according to claim 5 wherein said amplitude and phase compensation circuit includes inductive and capacitive components.

8. The method of claim 5, wherein the step of selecting a characteristic impedance of said amplitude and phase compensation circuit includes selecting the characteristic impedance of said amplitude and phase compensation circuit so that the amplitude of the first and second voltage signals is substantially equal to one-half the amplitude of the voltage signal appearing at the first port.

9. A circuit for compensating a three-wire twisted wire balun, the three-wire twisted-wire balun having first, second, and third ports, the first port coupled to a first terminal, the third port coupled to a third terminal, the circuit comprising:

an amplitude and phase compensation circuit coupled between the second port of the three-wire twisted-wire balun and a second terminal, said amplitude and phase compensation circuit having a characteristic impedance and an electrical length selected such that an amplitude difference of voltage signals appearing at the second and third terminals is substantially equal to zero volts within an operating bandwidth, and a magnitude of a phase difference of said voltage signals appearing at the second and third terminals is substantially 180 degrees within the operating bandwidth.

10. The circuit according to claim 9 wherein said amplitude and phase compensation circuit includes a transmission line.

11. The circuit according to claim 9 wherein said amplitude and phase compensation circuit includes inductive and capacitive components.

* * * * *

UNITED STATES PATENT AND TRADEMARK OFFICE

CERTIFICATE OF CORRECTION

PATENT NO. : 5,416,451

DATED : May 16, 1995

INVENTOR(S) : Robert S. Kaltenecker et al.

It is certified that error appears in the above-indentified patent and that said Letters Patent is hereby corrected as shown below:

On cover page, item [75] Inventors: delete "Pfitzenmayer" and insert therefor --Pfizenmayer--.

Signed and Sealed this

Twenty-ninth Day of August, 1995

Attest:

BRUCE LEHMAN

*Attesting Officer* *Commissioner of Patents and Trademarks*